United States Patent
Hazelzet et al.

(10) Patent No.: US 7,646,649 B2
(45) Date of Patent: Jan. 12, 2010

(54) MEMORY DEVICE WITH PROGRAMMABLE RECEIVERS TO IMPROVE PERFORMANCE

(75) Inventors: Bruce G. Hazelzet, Essex Junction, VT (US); Mark W. Kellogg, Poughkeepsie, NY (US); Darcie J. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 688 days.

(21) Appl. No.: 10/707,053

(22) Filed: Nov. 18, 2003

(65) Prior Publication Data

US 2005/0108468 A1    May 19, 2005

(51) Int. Cl.
  *G11C 11/00* (2006.01)
(52) U.S. Cl. .................. 365/189.05; 365/233.5
(58) Field of Classification Search ............ 365/189.05, 365/226, 233.55
See application file for complete search history.

(56) References Cited

U.S. PATENT DOCUMENTS

| | | | | |
|---|---|---|---|---|
| 5,513,135 A * | 4/1996 | Dell et al. ................. | 365/52 |
| 5,612,919 A * | 3/1997 | Arimoto ................... | 365/201 |
| 5,748,902 A | 5/1998 | Dalton et al. ............. | 395/200.76 |
| 5,917,364 A | 6/1999 | Nakamura ................ | 327/415 |
| 5,999,483 A * | 12/1999 | Itou ........................ | 365/233.1 |
| 6,046,943 A | 4/2000 | Walker ..................... | 365/189.05 |
| 6,243,779 B1 | 6/2001 | Devanney et al. ......... | 710/129 |
| 6,347,394 B1 * | 2/2002 | Ochoa et al. .............. | 716/6 |
| 6,356,485 B1 | 3/2002 | Proebsting ................ | 365/189.01 |
| 6,414,868 B1 * | 7/2002 | Wong et al. ............... | 365/51 |
| 6,493,394 B2 * | 12/2002 | Tamura et al. ............. | 375/257 |
| 6,693,483 B2 * | 2/2004 | Deml et al. ............... | 327/536 |
| 7,145,819 B2 * | 12/2006 | Penchuk ................... | 365/203 |
| 2002/0064075 A1 * | 5/2002 | Morishima ................ | 365/203 |
| 2003/0035328 A1 * | 2/2003 | Hamamatsu et al. ....... | 365/200 |
| 2003/0112668 A1 * | 6/2003 | Takahashi et al. ......... | 365/200 |

* cited by examiner

*Primary Examiner*—Michael T Tran
(74) *Attorney, Agent, or Firm*—David Cain

(57) ABSTRACT

A memory system having a plurality of DRAMs which are selectively provided non-inverted or inverted signals. The DRAMs have the ability to accept non-inverted or inverted address/command signals from a register that drives a plurality of signals simultaneously. The system includes DRAM receivers with programmable input polarity and a register with programmable output polarity.

10 Claims, 1 Drawing Sheet

MEMORY DEVICE WITH PROGRAMMABLE RECEIVERS TO IMPROVE PERFORMANCE

BACKGROUND OF INVENTION

1. Technical Field

The present invention relates generally to the field of computer memory and more particularly, to multiple synchronous dynamic random access memory (DRAM) systems requiring faster performance.

2. Background

In recent years, the free fall of processor cycle times to levels well below access times of most dynamic random access memories has generated extensive research and development, the result of which has been the development of several generations of synchronous memory devices. Virtually all previously available semiconductor dynamic random access memory (DRAM) and many static random access memory (SRAM) devices used asynchronous clocking systems in that the clocking signals necessary to perform memory access functions are not synchronized to the associated system processor. Although memories were accessed by signals sent by the processor, the exact time interval between the time a request was sent to a memory and the time a response was received was dependent on the particular internal features of the memory. Thus, it was necessary for system designers to allow for the "worst case" response time between requests for information and the anticipated time the information was available, which necessarily wasted time in the handling of many memory functions.

Improvements in semiconductor processing technology has enabled logic components such as microprocessors to operate at clock rates in excess of 3 GHz. Memory system clock rates have not kept pace because of the nature of DRAM memory devices. In order to perform well with these higher speed processors, synchronous dynamic random access memories (SDRAMs), operable with clock rates of up to 266 MHz and data rates of up to 533 M Bits per second, have been designed. SDRAMs are responsive to a high frequency clock signal generated by the system clocking circuitry often running at a clock multiple versus the processor, which renders all internal activity within the memory "synchronous" with other devices responsive to the same (or related) clock signal(s). In the synchronous approach, all SDRAM address and control inputs are sampled at the positive edge of the input clock, and all SDRAM outputs on recent DDR (Double Data Rate) SDRAMs are valid on subsequent positive and negative edges. This technique permits input/output transactions to take place on every clock cycle. SDRAMs can simplify both the overall system design and the memory-management subsystem, because the main memory operates in a deterministic, synchronous nature relative to the system clock.

As frequencies increase and cycle times decrease, memory designers are looking for additional ways to improve memory performance and timing margins. One element that can be improved is the timing latency component due to the simultaneous switching affect of all the drivers to the SDRAMs switching in the same direction at the same time. This delay contribution is known as simultaneous switch time (tSS). In recent low cost designs, this delay adder for tSS was as much as 1.06 ns. This contribution was 14% of the total timing budget for a memory subsystem running at a 7.5 ns cycle time.

Solutions to reduce the simultaneous switching delay adder include higher priced packaging, splitting the function across several components or running the memory at an increased cycle time. Increased number of address/command signals due to larger DRAM or module densities only add to the simultaneous switching time delays for high performance/low cost memory solutions. The price tag for two single 14 bit 1:2 registers is usually less than about $2.00.

Furthermore, the concept of driving buses with half of the drivers providing non-inverting polarities and the other half of the drivers providing inverted polarities is a known way of reducing simultaneous switching affects. But this technique does not cover devices receiving those signals to accept the inverted signal polarity and still function as if they received the non-inverted signal polarity.

Further, synchronous memory devices do not include the ability to be programmed to accept non-inverted or inverted address/command signals, so this technique has not previously been viable.

SUMMARY OF INVENTION

As clock frequencies increase and the cycle times decrease, the timing delay contribution of simultaneous switching noise on the address/command bus, in a memory subsystem, is undergoing greater scrutiny. To achieve the emerging system memory performance targets (up to 500 MHz clock speeds on multi-drop buses), new designs are required to ensure robust operation of the memory subsystem, without also incurring significant reductions in the system memory device count.

Further, as clock frequencies increase, the delay contribution of simultaneous switching push out on the address and command bus, in a memory subsystem, is becoming a major detractor. The present invention is directed to reduce the timing adder due to the drivers (which interface to the memory) switching all at the same time, in the same direction, thus allowing the memory system to meet faster performance and/or providing greater timing margin. This is accomplished by the use of drivers interfacing to the memory which provides both non-inverted and inverted address/command polarities to the SDRAMs. The SDRAMs have the capability to accept either non-inverted or inverted address/command polarities.

An example of the simultaneous switch impact is evident in the timing analysis (known as post-register timing analysis) on a Double Data Rate (DDR) SDRAM Registered DIMM (Dual Inline Memory Module), which consists of DDR SDRAMs, a PLL for clock distribution on the module and one or more registers that latch and re-drive the address and command signals from the system memory controller to the SDRAMs (Synchronous DRAMs). The simultaneous switching push-out due to the drivers internal to the register switching at the same time has been as large as 700 ps at a cycle time of 10 ns (JEDEC Standard PC100 Registered DIMM). With current designs, the simultaneous switch push-out has been reduced to approximately 300 ps at a cycle time of 3.75 ns, but this continues to be approximately 7-8% of the timing budget. This simultaneous switch noise could be reduced by improving the register package, by further splitting the register function across multiple devices, or by reducing the memory load, and each has been leveraged to the acceptable cost/performance limit for the current technology. The present invention provides an alternate solution, whereby the DRAM itself is designed to operate with non-inverted or inverted address and command inputs.

Since many current (and most future) multi-drop memory subsystems will include pipelined address and command inputs (with these signals re-driven close to the DRAMs), it is viable to design a memory device and memory sub-system to accommodate non-inverted and inverted address and command inputs to the DRAM. Also, since most high speed memory re-drive circuits will include multiple address/command outputs for a given input (for example, current and planned DDR DIMMs use 1:2 registers), the register can be designed to generate both non-inverted and inverted copies of the inputs (one each per input). This feature could be enabled, for example, via an external programming pin. Since SDRAMs are sensitive to the polarity of the address and commands for device programming and certain decoded operations, the memory devices would also require programming (such as via an external pin) to properly function with inverted inputs. The latter could easily be accomplished by either inverting or not the address and commands on the DRAM device, after the input receivers. In both the case of the DRAM and the register(s), the programming pin can be tied to ground to accept one polarity and tied to Vdd to accept the opposite polarity—thus always ensuring the correct signal polarity internal to the DRAM.

Although the embodiment described is in the context of a memory module (DIMM), this invention is not limited to memory modules which include registers. Using this method, the simultaneous switch noise can be reduced in any memory subsystem which includes sufficient signals that simultaneous switch has a measurable affect on overall bus performance. It can also be expanded to include situations where only half of the memory address and control signals are inverted, or only the address signals are inverted, or only the command signals are inverted, or any other combination.

It should also be understood tat increased package density and/or reductions in the area allocated to the memory subsystem will result in increased simultaneous switching affects, as more outputs on fewer packages will be switching, and current methods will not serve to decrease the number and combinations of outputs switching at a given time. The proposed solution may provide only a small benefit (10-20%) in applications with several re-drive devices, but a very sizeable benefit (50% or greater) in applications with a single re-drive device and a large number of inputs and outputs. Current plans for DDR II server memory subsystems include low-cost registers wit 28 inputs and 2 to 3 output copies.

It is therefore an object of the present invention to provide a significant benefit to the post-register timing.

Another object is to obtain maximum operating clock speed for the memory subsystem.

These and other objects, advantages and features of the present invention will be more readily understood from the following detailed description of certain preferred embodiments of the invention.

DETAILED DESCRIPTION

Figure 1:
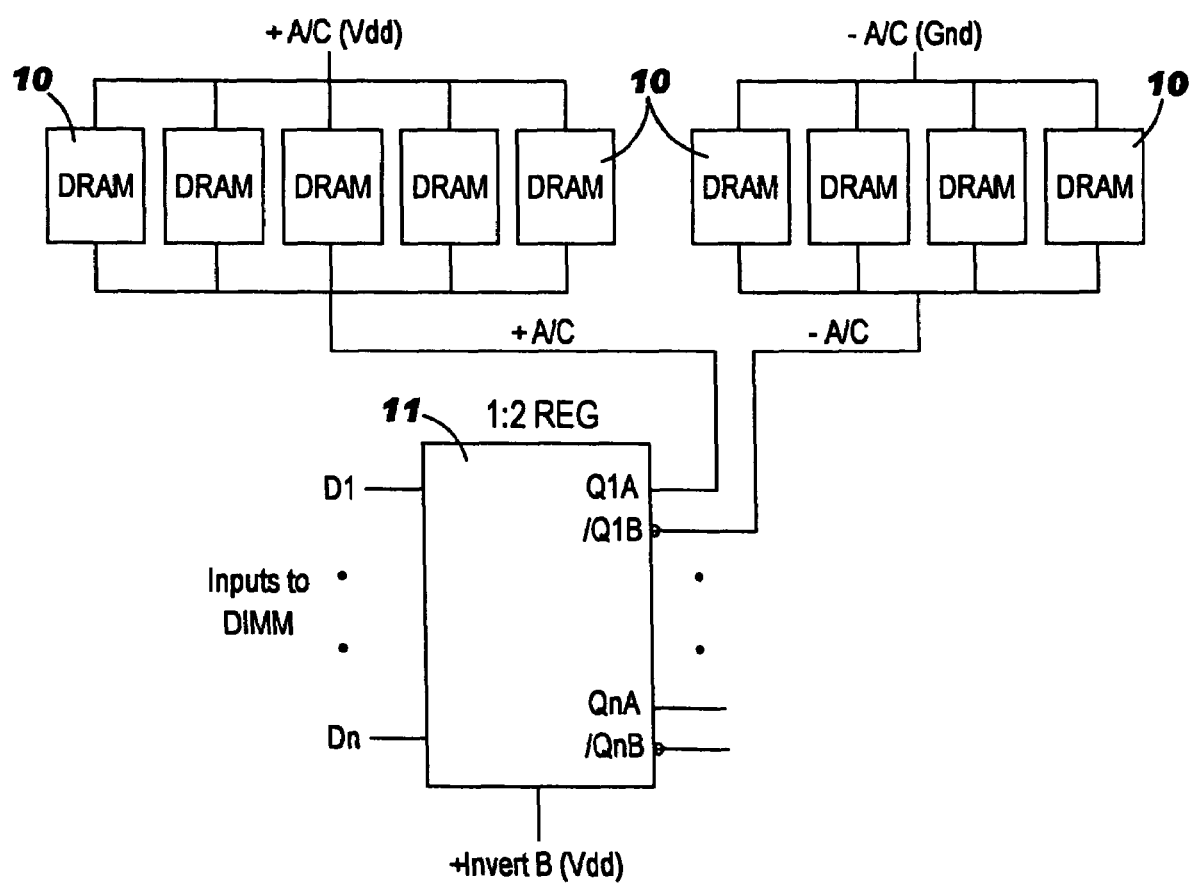
FIG. 1 is a block diagram of a DIMM designed in accordance with the present invention.

A memory module in accordance with the present invention contains multiple synchronous memories which are physically similar and architecturally compatible with a conventional memory module containing multiple asynchronous memories. For purposes of explanation the implementation of the invention utilizes a dual in-line memory module (DIMM) containing multiple synchronous memories. However, the invention is equally applicable to single in-line memory modules (SIMMs), and other arrangements in keeping with the spirit of the invention. Along with the advantage of compatibility, a memory module of synchronous memory in accordance with the present invention preferably employs special placement and wiring of decoupling capacitors about the synchronous memories to reduce simultaneous switching noise during read and write operations.

Attention is directed to FIG. 1 which illustrates the use of the present invention in a DIMM module using a register and DRAM with inverted address/command (A/C) nets. A plurality of DRAMs 10 are arranged on a DIMM module. A register 11 is shown receiving inputs to the DIMM from a memory controller not shown for each DRAM (D, . . . Dn) along with an inverted B input which is tied to Vdd. The register 11 is programmed to provide non-inverted address/command inputs (+A/C) and inverted inputs (−A/C) to selected DRAMs 10. The selected DRAMs 10 accept either a +A/C or a −A/C signal based on the polarity of the program pin A/C on each DRAM which is tied to Vdd for non-inverting inputs and to Gnd (ground) for inverted inputs.

The simplest implementation of this invention is to use programmable pins on both the register and DRAM. These program pins are hardwired by design on the DIMM module and therefore transparent to the system. Another implementation option is to have this programmability built into the DRAM and register or memory controller via programmable registers. This is more complex and would require the memory controller/processor to interrogate the devices to see if this option is on the devices during the initialization as well as the DRAMs and memory controller or register coming up in a default state (all non-inverted). Then the memory controller would then program the devices to either stay as non-inverted or change to inverted. This programming can be done by writing a register in the devices via a special command on the existing bus or could be done in parallel via a separate bus such as an I2C serial bus or JTAG bus.

As mentioned above, conventional methods for reducing simultaneous switch noise included: improving the power and ground distribution within the package (adding cost and increasing device and card wiring complexity); slowing down the drivers that are driving the signals to the DRAMs (which impacts performance); reducing the number of drivers per component (adding cost and requiring additional space); and reducing the re-driven signal count (by reducing the component density). It should be realized that the subject invention provides the greatest benefit at the lowest cost.

Others have had to go with more complex and expensive packaging to reduce the simultaneous noise, or have used additional components to spread the function across multiple devices. The present invention reduces the maximum count of drivers tat will be switching in any one direction at a time, by utilizing a memory device that is designed to accept inverted inputs when so programmed. This invention will not add complexity or cost to either part, and the performance benefit gained will exceed the minimal delay impact that might occur in the memory or register device. In addition, this design decreases the mn/max timing variation (spread) for all possible output signal combinations, thereby increasing the valid window of time for these signals at the receiving device. Independent of all other factors, increasing the valid window for these signals will permit higher frequency operation.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A memory system comprising:
   a plurality of DRAMs having circuits to accept non-inverted input signals and inverted input signals;
   a register programmed to provide inverted and non-inverted signals to the DRAMs; and
   programmable pins in the register and the DRAMs to enable operation in either non-inverted or inverted mode, wherein a first programmable pin is connected to ground to enable an inverting mode and a second programmable pin is connected to Vdd to operate in a non-inverting mode.

2. The memory system of claim 1 which indicates re-drive circuitry, which can output both non-inverted and inverted polarity signals from one or more input signals.

3. The memory system of claim 1 wherein the DRAMs are mounted on a DIMM.

4. A memory system of claim 1 in which the register drives either non-inverted or inverted signals to the DRAMs using a programmable pin.

5. A memory system comprising:
   a plurality of DRAMs having receiver circuits adapted to interface with a plurality of signal drivers capable of providing both non-inverted and inverted address and command signal polarities to the plurality of DRAMs; and
   a memory controller capable of enabling the plurality of DRAMs to accept either non-inverted or inverted signals using the programmable pin, which dynamically configures the polarities of address and command signals exchanged between a plurality of signal drivers and the plurality of DRAMs, such that simultaneous switching noise in the memory system is reduced.

6. The memory system of claim 5 wherein the pin is hard-wired to the DRAMs.

7. A memory system comprising:
   a module having a plurality of DRAMs with inputs and outputs and circuits to accept either non-inverted input signals or inverted input signals, wherein pre-selected DRAMs may operate in inverted mode with some critical signals remaining in a non-inverted mode;
   a means connected to the circuit for changing modes to accept inverted input signals; and
   a memory controller which is programmable to operate in non-inverted mode at power up and to change after it is programmed.

8. The memory system of claim 7 wherein the memory controller may operate in the inverted mode with some critical signals remaining in the non-inverted mode.

9. The memory system of claim 7 wherein a programmable pin is hard-wired to the module.

10. The memory system of claim 7 wherein the means for changing modes includes a pin that is controlled by the memory controller.

* * * * *

UNITED STATES PATENT AND TRADEMARK OFFICE
CERTIFICATE OF CORRECTION

PATENT NO. : 7,646,649 B2  Page 1 of 1
APPLICATION NO. : 10/707053
DATED : January 12, 2010
INVENTOR(S) : Hazelzet et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 938 days.

Signed and Sealed this

Sixteenth Day of November, 2010

David J. Kappos
*Director of the United States Patent and Trademark Office*